(12) United States Patent
Arao et al.

(10) Patent No.: US 7,232,715 B2
(45) Date of Patent: Jun. 19, 2007

(54) METHOD FOR FABRICATING SEMICONDUCTOR FILM AND SEMICONDUCTOR DEVICE AND LASER PROCESSING APPARATUS

(75) Inventors: Tatsuya Arao, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 178 days.

(21) Appl. No.: 10/706,978

(22) Filed: Nov. 14, 2003

(65) Prior Publication Data
US 2004/0106242 A1 Jun. 3, 2004

(30) Foreign Application Priority Data
Nov. 15, 2002 (JP) ............................. 2002-332434

(51) Int. Cl.
H01L 21/84 (2006.01)
(52) U.S. Cl. ............................. 438/166; 257/E21.561
(58) Field of Classification Search ........ 438/151–166; 257/E21.621
See application file for complete search history.

(56) References Cited

U.S. PATENT DOCUMENTS

| | | | |
|---|---|---|---|
| 4,952,770 A | | 8/1990 | Hayashi |
| 5,147,826 A | * | 9/1992 | Liu et al. ..................... 438/486 |
| 5,432,122 A | * | 7/1995 | Chae ........................ 438/157 |
| 5,569,610 A | | 10/1996 | Zhang et al. |
| 5,608,232 A | | 3/1997 | Yamazaki et al. |
| 5,614,733 A | | 3/1997 | Zhang et al. |
| 5,639,698 A | | 6/1997 | Yamazaki et al. |
| 5,643,801 A | | 7/1997 | Ishihara et al. |
| 5,783,468 A | | 7/1998 | Zhang et al. |
| 5,891,764 A | | 4/1999 | Ishihara et al. |
| 5,897,347 A | | 4/1999 | Yamazaki et al. |
| 5,925,410 A | * | 7/1999 | Akram et al. ............... 427/240 |
| 5,942,138 A | | 8/1999 | Toda et al. |
| 6,027,960 A | * | 2/2000 | Kusumoto et al. .......... 438/166 |
| 6,198,070 B1 | | 3/2001 | Nakayama |
| 6,242,291 B1 | | 6/2001 | Kusumoto et al. |
| 6,348,369 B1 | | 2/2002 | Kusumoto et al. |
| 6,528,359 B2 | | 3/2003 | Kusumoto et al. |
| 6,638,800 B1 | | 10/2003 | Ishihara et al. |
| 6,642,073 B1 | | 11/2003 | Zhang et al. |
| 6,642,091 B1 | * | 11/2003 | Tanabe ....................... 438/166 |
| 6,660,609 B2 | | 12/2003 | Tanaka et al. |
| 6,678,304 B2 | | 1/2004 | Morishige |

(Continued)

FOREIGN PATENT DOCUMENTS

JP    11-204433    7/1999

(Continued)

*Primary Examiner*—Richard A. Booth
(74) *Attorney, Agent, or Firm*—Eric J. Robinson; Robinson Intellectual Property Law Office, P.C.

(57) ABSTRACT

A technique to control segregation of impurities when reforming crystallinity and crystallization of a semiconductor film by using a laser beam irradiation is provided. The present invention is to irradiate the substrate with applying ultrasonic vibration while keeping the end portion of the substrate in space. The substrate on which a semiconductor film is formed is kept onto the stage provided with opening pores, and floated by spouting gas from opening pores. Supersonic vibration can be efficiently provided to the substrate by irradiating with a laser beam with ultrasonic vibration while keeping the end portion of the substrate.

28 Claims, 12 Drawing Sheets

U.S. PATENT DOCUMENTS

| | | |
|---|---|---|
| 6,777,642 B2 | 8/2004 | Song et al. |
| 6,855,584 B2 | 2/2005 | Yamazaki et al. |
| 6,890,387 B2 | 5/2005 | Morishige et al. |
| 6,927,109 B1 * | 8/2005 | Tanaka et al. ............. 438/166 |
| 2002/0153360 A1 | 10/2002 | Yamazaki et al. |
| 2002/0187594 A1 | 12/2002 | Yamazaki et al. |
| 2003/0031214 A1 * | 2/2003 | Tanaka et al. ................ 372/9 |
| 2003/0058916 A1 | 3/2003 | Tanaka et al. |
| 2003/0068872 A1 | 4/2003 | Kusumoto et al. |
| 2004/0069751 A1 | 4/2004 | Yamazaki et al. |
| 2004/0171237 A1 | 9/2004 | Tanaka et al. |
| 2005/0112850 A1 | 5/2005 | Yamazaki et al. |

FOREIGN PATENT DOCUMENTS

| | | | |
|---|---|---|---|
| JP | 2001085354 A | * | 3/2001 |

* cited by examiner

METHOD FOR FABRICATING SEMICONDUCTOR FILM AND SEMICONDUCTOR DEVICE AND LASER PROCESSING APPARATUS

BACKGROUND OF THE INVENTION

1. Field of the Invention

The present invention relates to a method for fabricating a semiconductor film having a crystal structure and a method for fabricating a semiconductor device using the semiconductor film. Specifically, the present invention relates to a technique to increase crystallization and crystallinity by irradiating a semiconductor film with a laser beam. In addition, the present invention relates to a laser processing device which is used for the semiconductor film and the semiconductor device.

2. Description of the Related Art

A crystallization technique to form a polycrystalline silicon (polysilicon) by exposing an amorphous silicon film deposited on a glass substrate to a laser beam has been known. A pulsed excimer laser oscillator is a light source which is typically used for the crystallization technique. It is considered that silicon is instantaneously heated and melted due to the irradiation of a pulsed laser beam, and crystallization is occurred in the subsequent cooling process. In consequence, it is known that polycrystallization in which several crystal grains having different plane directions are collected is formed.

In crystallization of amorphous silicon using an excimer laser which is typically used, a silicon is selectively heated through irradiating with a pulsed laser beam with a pulse width of several ten nanosecond to several hundred nanosecond, thereby the silicon is crystallized without thermally damaging a glass substrate. The crystallization technique has attracted attention as a technique to form a semiconductor layer with a thin film transistor (TFT) which is used for a liquid crystal display device.

As shown in FIG. 5, a polysilicon film often used previously is formed by the following steps: forming a base insulating film 11 such as silicon nitride or silicon oxide over a glass substrate 10, irradiating an amorphous silicon film with a thickness of 50 nm formed over the base insulating film with an excimer laser beam at a laser pulsed frequency of 300 Hz (pulse width of 30 nsec), and then crystallizing the amorphous silicon film. Still, projections having a shape like mountain chain such as a projection 14 are formed onto the surface of the polysilicon film 13.

In the case of forming a TFT, a gate insulating film with a film thickness of approximately 100 nm is formed thereon. A decline of withstand pressure for an gate insulating film is caused due to the higher concentration of electric field at the projection area and the increased gate leak current. As the measure, there is a technique for preventing projections due to the segregation of impurities from generating onto the surface of the substrate by preventing the segregation of impurities with applying ultrasonic vibration to the substrate during crystallization by means of exposing the film to a laser beam. (Reference 1, Japanese patent Laid-Open 11-204433)

As previous experimental knowledge, it is known that a large grain size of crystallization is provided through crystallizing an amorphous silicon film in the atmosphere including oxygen by exposing the film to a laser beam.

A pulsed excimer laser is condensed into a linear shape through crossing optical lens to scan an amorphous silicon film. Thus, the whole surface of the amorphous silicon onto the glass substrate can be crystallized. However, the semiconductor film irradiated with the laser beam becomes high temperature and a state of solvent, and then, reacts with oxygen and nitride in the atmosphere. The resulted substance get into the film and the surface of the film, namely, exogenous impurities are mixed into the film and the surface of the film. Accordingly, the impurities causes a crystal defect or become a factor of damaging a quality of the crystallization due to the segregated impurities in the grain boundary.

Since these mixing of impurities occur unintentionally, the crystallized semiconductor film processed with a laser beam includes a local characteristic dispersion. Therefore, that becomes characteristic dispersion of a TFT formed by using the above semiconductor film, and a problem that characteristic dispersion among plural TFTs elements in the same substrate surface is caused.

In the above-described reference 1, it is described that segregation of impurities can be prevented and the occurrence of the projections onto the surface of a substrate due to the segregation of impurities can be prevented by applying ultrasonic vibration to the substrate. However, in the case of using a method to connect a ultrasonic vibration source with a stage on which a glass substrate is mounted, ultrasonic vibration source can not adhere to the stage because of a curve on the glass substrate, and ultrasonic vibration can not propagate efficiently. The tendency becomes increasingly prominent as the size of the glass substrate becomes bigger.

SUMMARY OF THE INVENTION

The present invention is proposed in view of the foregoing problems. Hence, it is an object of the present invention to provide a technique to control segregation of impurities during reforming the crystallinity and the crystallization of a semiconductor film by irradiation of a laser beam.

The present inventors have examined the cause of dispersion in crystallinity about the semiconductor film which is crystallized by irradiation of a laser beam. The examination will be explained with reference to FIG. 4.

As shown in FIG. 4A, an amorphous silicon film 412 is formed over a substrate 410 through a base insulating film 411. The region which is irradiated with a pulsed laser beam 420a is crystallized and a crystalline silicon film 413 is formed. At this moment, the amorphous silicon film 412 is irradiated with pulsed laser beam 420a in the atmosphere including oxygen such as in the air; a silicon film is heated and becomes a state of solvent. As an example, in case that the pulsed laser beam 420a has the vibration frequency of 300 Hz and pulse width of 30 nsec, the silicon is cooled and solidified by the time the silicon film is irradiated with the next pulsed laser beam. The crystallization progresses by the time the silicon is irradiated with the laser beam and solidified, however, the silicon film becomes high temperature and an oxide 414(SiOx) can not be prevented from forming onto the silicon film when processing in the air. (FIG. 4A)

Here, by irradiating with the next pulsed laser beam 420b while overlapping the beam spot of the laser beam on the film, oxides 414 having higher melting point than that of silicon becomes into pieces and are added into the melted silicon. (For example, 414b shown in FIG. 4B). When the oxides 414b is segregated and concentrated into a grain boundary, dispersion in electric resistance is caused depending on the quantity or presence or absence of the oxides 414b. Namely, an influence of barrier will be caused in the crystal grain boundary due to the oxides 414b.

When the film is irradiated with a laser beam in the atmosphere including nitride, it is expected that a piece of the nitride (SiNx) be also mixed into the melted silicon and be segregated into a grain boundary.

Since an oxide and a nitride are electrical isolation, dispersion in electric conductivity of the silicon film is not small. In addition, pieces of the oxide melted in the silicon are mixed into the silicon film and work as an alleviation of lattice stress. In addition, favorable electrically properties can be obtained by carrying out laser irradiation in the atmosphere of oxygen compared with the case in the atmosphere of nitride since oxides do not become hindrance for taking hydrogen in the semiconductor film during hydrogenation process.

In the present invention, in the process for improving the crystallization and the crystallinity of a semiconductor film which is typified by silicon, ultrasonic vibration is applied to the substrate or the semiconductor film on the substrate to shatter and disperse the pieces of oxides and nitrides. Thus, segregation of oxides, nitrides or the like can be prevented.

In the present invention, in a laser annealing technique for crystallizing a amorphous semiconductor film formed over a substrate, improving crystallinity of polycrstal semiconductor film, or recrystallizing after ion doping, a method for fabricating a semiconductor film comprises irradiating a semiconductor film formed over a substrate with a laser beam to crystallize the semiconductor film, wherein ultrasonic vibration is applied to the substrate during irradiating the laser beam while holding an end portion of the substrate. Further, the method comprises holding a substrate over a stage having pores wherein said substrate is provided with a semiconductor film, spouting gases from the pores to float the substrate, and irradiating a semiconductor film formed over the substrate with a laser beam while holding an end portion of the substrate, wherein during irradiating the laser beam, ultrasonic vibration is applied to the substrate. Thus, supersonic vibration can be efficiently provided to the substrate.

In the present invention, a semiconductor film comprising a amorphous structure is formed and crystallized using irradiation of a laser beam with ultrasonic vibration by a method for fabricating a semiconductor device including processes for crystallizing of amorphous semiconductor film formed onto a substrate and improving crystallinity of a polycrystal semiconductor film.

A semiconductor film may be crystallized by irradiating with a pulsed laser beam which is condensed into a linear shape with applying ultrasonic vibration while the substrate is floated. The pulsed laser beam is used to crystallize the whole area of the semiconductor film by moving the beam spot on the film to overlap each other. The laser beam can be emitted in the air, in the inert atmosphere, in the reduction atmosphere, in the oxidizing atmosphere or under reduced pressure (or in vacuum).

In addition, the present invention provides a laser processing apparatus comprising a means for floating and moving the substrate horizontally, an optical system for condensing a laser beam in a rectangle or a linear shape, and a means for applying ultrasonic vibration to the substrate. Further, the laser processing apparatus can move a substrate in horizontal direction by a means for moving the substrate in one direction while keeping the end portion of the substrate and a means for floating the substrate in space. Further, the laser processing apparatus comprises an optical system to irradiate the substrate with a laser beam, and a means for applying ultrasonic vibration to the substrate from a region of keeping the substrate.

The energy of the ultrasonic vibration can be utilized to shatter and disperse the pieces of oxides and nitrides formed on the surface due to the irradiation of the laser beam. The vibration frequency is equal to or more than 100 kHz and equal to or less than 30 MHz. The effect of the ultrasonic vibration depends on the vibration frequencies, and it is preferable to set vibration frequency of equal to or more than 100 kHz and equal to or less than 2 MHz to finely chatter the pieces of oxides and nitrides. Also, it is more preferable to set the vibrations frequency of equal to or more than 1 MHz and less than 30 MHz to eliminate projections onto the surface of the semiconductor film.

Namely, as a model shown in FIG. 3, a crystalline silicon film 413 is formed by irradiating an amorphous silicon film 412 onto a base insulating film 411 formed on a substrate 410 with a pulsed laser beam 420a while being added with ultrasonic vibration. In the process, an oxide 414(SiOx) is formed onto the surface of the semiconductor film; however, the oxide is shattered into pieces (FIG. 3A). Further, after the irradiation of the pulsed laser beam 420b, the oxide 414 can be prevented from segregating into the particular region of crystalline silicon film 413 (FIG. 3B). Therefore, pieces of oxide can be prevented from concentrating in a grain boundary, and thus dispersion in electric resistance can be reduced.

To prevent oxides and nitrides from generating on the surface of the semiconductor film due to the irradiation of the laser beam, it can be carried out in the rare atmosphere, in the reduction atmosphere, or in vacuum.

As described above, the present invention is to perform crystallization without segregating impurities by using a laser beam irradiation while applying ultrasonic vibration to a substrate on which amorphous semiconductor film is formed. Further, the present invention can be applied to the crystallization of a semiconductor film using a catalytic element. Namely, a metallic element or a metallic compound which have catalytic action to promote crystallization is added to the amorphous semiconductor film formed on the substrate and subsequently the film is irradiated by a laser beam while applying ultrasonic vibration after crystallizing a part of or whole area of the semiconductor film by heat treatment. Thus, the film can be crystallized without segregating impurities, the metallic element or the metallic compound being mixed unintentionally in the specific regions.

In addition, an amorphous semiconductor film in this invention is not limited to the one which has a complete amorphous structure in a strict sense, but includes the one which comprises a state having a minute crystal grain, so-called a microcrystalline semiconductor film, or a semiconductor film locally having a crystal structure. Besides, an amorphous silicon film which is typically used, an amorphous silicon germanium film and an amorphous silicon carbide film can be applied to the amorphous semiconductor film.

DETAILED DESCRIPTION OF THE PREFERRED EMBODIMENTS

The embodiment mode of the present invention is described in detailed with reference to drawings. However, it is easily understood by those skilled in the art that the present invention is not limited to the following description and can be freely changed the modes and the details without any departure from the purpose and the scope of the invention. Therefore, the invention should not be limited to interpret to the description of the following embodiment modes.

[Embodiment Mode 1]

Figure 1:
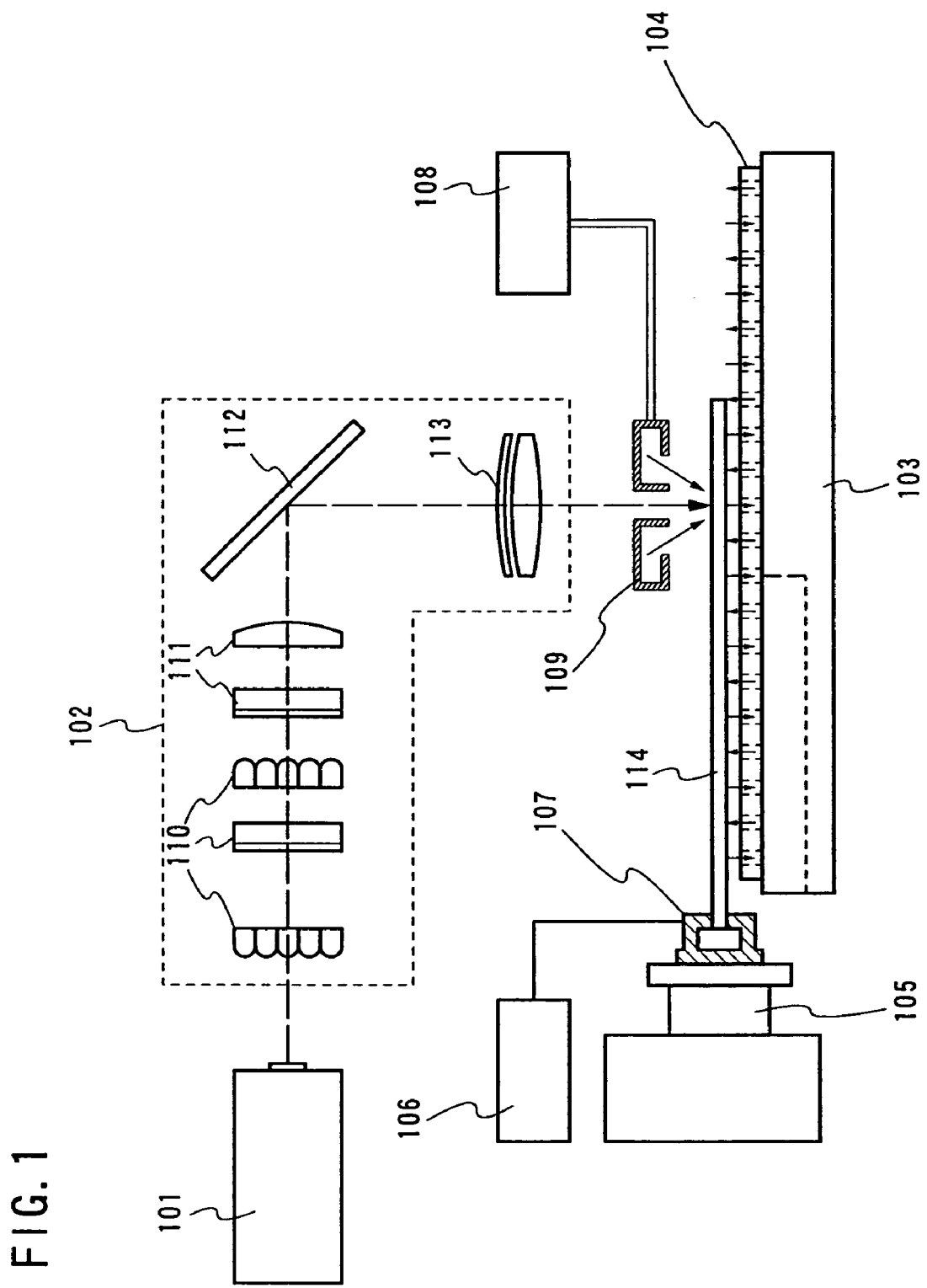
FIG. 1 is a diagram showing a mode of the laser processing apparatus according to the present invention.

FIG. 1 is a diagram showing one mode of a laser processing apparatus according to the present invention. And the apparatus comprises a laser oscillator 101, an optical system 102, a stage 103, a substrate floating means 104, a transporting means 105 for pinching and moving the substrate, and an ultrasonic vibration source 106 for applying ultrasonic vibration to the chuck 107.

A laser beam irradiated from a laser oscillator 101 is condensed and extended to form a shape of beam spot into a fine linear shape by the optical system 102. A structure of the optical system 102 is properly decided, however, the optical system 102 comprises, for example, a cylindrical lens array 110, a cylindrical lens 111, a mirror 112, a doublet cylindrical lens 113, and the like. Though it depends to the size of the lens, it is possible to irradiate a linear laser beam having approximately from 100 to 400 mm (length) in the longitudinal direction and approximately from 100 to 500 um(length) in the lateral direction.

Moreover, a gas supply means 108 and a nozzle 109 may be provided for the purpose of controlling the atmosphere around a laser beam irradiation section. It is possible to control the atmosphere without providing any particular chamber by replacing atmosphere around the laser beam irradiation section with the gas spouted from the nozzle 109. The supply of oxidizing gas, reducing gas, and inert gas from the gas supply means 108 is possible. By the selection of the gas, oxide can be taken into the semiconductor film actively, or rare gas such as argon (Ar) can be taken thereinto.

Furthermore, a structure in which heated gas is to be spouted from the nozzle 109 may be adopted by adding a heating means to the means for controlling the atmosphere. As a result, a formed substance such as a substrate in the end portion of a laser beam irradiation section or a semiconductor film over the substrate can be heated. And it takes a long time to melt a semiconductor film which is irradiated by a laser beam, then a planarization effect can be achieved even if ultrasonic vibration frequency applied to the substrate is equal to or less than 1 MHz.

Needless to say, irradiation of a laser beam in the air, or irradiation of a laser beam under reduced pressure (or in vacuum) while keeping a stage 103 in the chamber can be performed without providing a special means described above.

A gas laser such as an excimer laser which oscillates light having a wavelength of 400 nm or smaller, or a solid-state laser such as a YAG, a $YVO_4$ or a YLF laser are used as the laser. A basic wave (1064 nm), a second harmonic (532 nm), a third harmonic (354.7 nm) or the like can be used in the YAG and the $YVO_4$ laser into which Cr, Nd, Er, Ho, Ce, Co, Ti, or Tm is doped. Concerning the lasers, a pulsed laser is used and an oscillation frequency of approximately from 5 to 300 Hz is adopted.

The substrate floating means 104 is provided with the stage 103. A substrate 114 is floated over the stage 103 by providing with opening pores for spouting and absorbing gas, and controlling respective flow volume or flow rate. The substrate floating means 104 and the end portion of the substrate are pinched to combine with the transporting means 105 which moves the substrate to the uniaxial direction or the biaxial direction. Thus, a structure in which a conveyor means to conveyor the substrate 114 kept floating in the space can be attained. An irradiation of a laser beam condensed in a rectangle or a linear shape can be performed on the entire surface of the substrate. Further, ultrasonic vibration supplied from ultrasonic vibration source 106 is provided with the chuck section 107 in the transporting means 105, subsequently, thereby the propagating the vibration efficiently to the substrate. Alternatively, a structure in which the substrate 114 is fixed with pinching by the chuck 107 and the laser beam is scanned by a polarization means such as a galvanometer mirror may be employed.

This type of laser irradiation apparatus is particularly effective in the case of processing a glass substrate with a length of one side more than 1000 mm and a thickness equal to or less than 1 mm. For example, a glass substrate which has a size of 1200 mm×1600 mm or 2000 mm×2500 mm and has a thickness of 0.4 to 0.7 mm can be processed. A glass substrate easily curves if the surface area of the glass substrate is large-sized and the thickness thereof becomes small. However, the substrate can be kept with maintaining a level surface by holding the substrate using the gas spouted from the fine pores as described in a structure of a stage 103. Further, the glass substrate does not contact with any subject except the transporting means 105 which provide with ultrasonic vibration, thus, ultrasonic vibration can be efficiently applied to the glass substrate without diminishing the ultrasonic vibration.

The condition of the crystallization can be properly selected by selecting the gas blown from the nozzle 109 from among oxidizing gas, reducing gas, or inert gas in the laser irradiation apparatus. A structure of this type of laser irradiation apparatus does not need a chamber which controls the atmosphere during the irradiation of a laser beam, therefore, even if the substrate becomes a large size, small sized irradiation apparatus can be achieved.

Figure 2A:
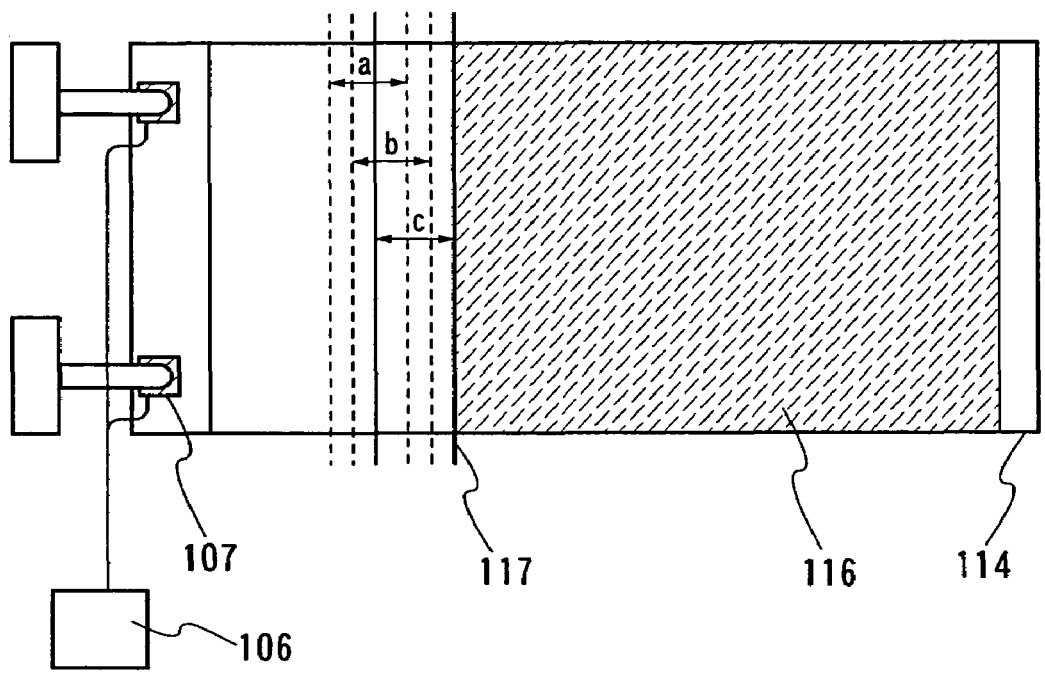
FIGS. 2A and 2B are diagrams showing a stage section of the laser processing apparatus, and a conveyor means according to the present invention is detail.
Figure 2B:
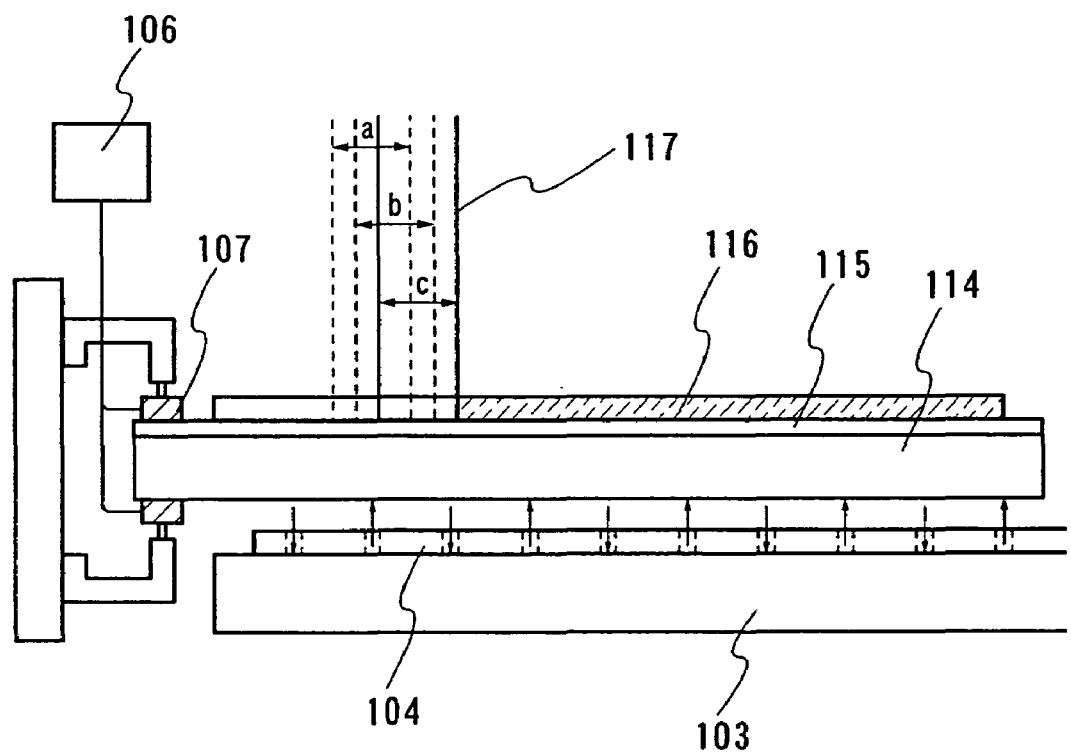
Figure 3A:
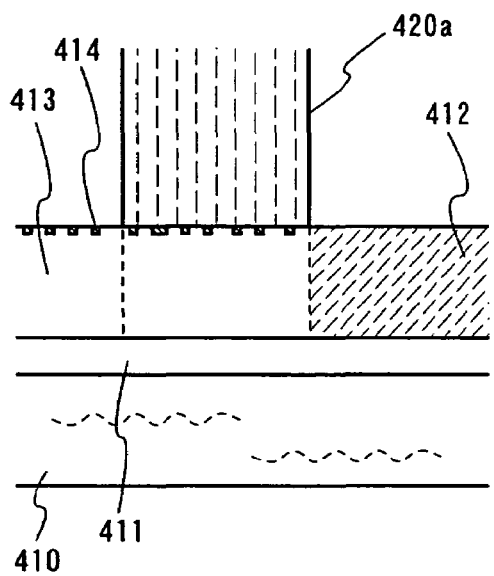
FIGS. 3A and 3B are diagrams showing a model of segregation of impurities during the process of a laser beam irradiation.
Figure 3B:
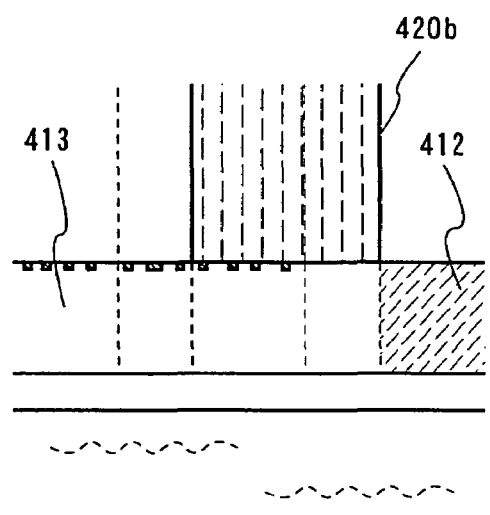
Figure 4A:
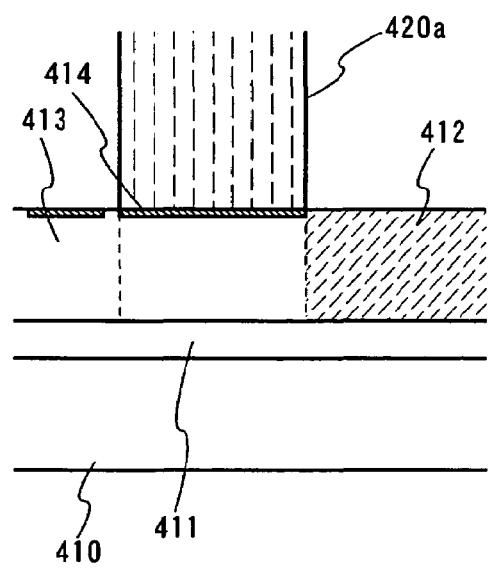
FIGS. 4A and 4B are diagrams showing a model in which segregation of impurities can be prevented during the process of a laser beam irradiation.
Figure 4B:
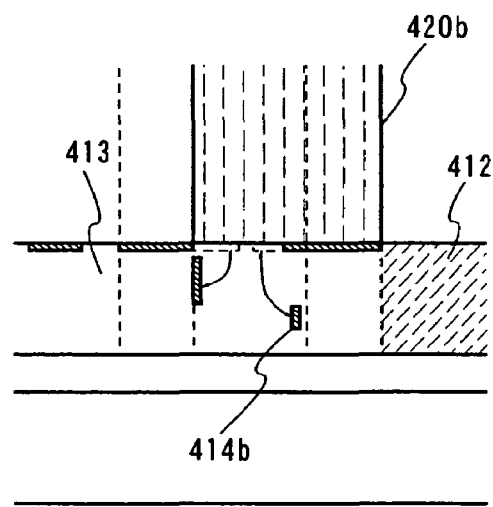
Figure 5:
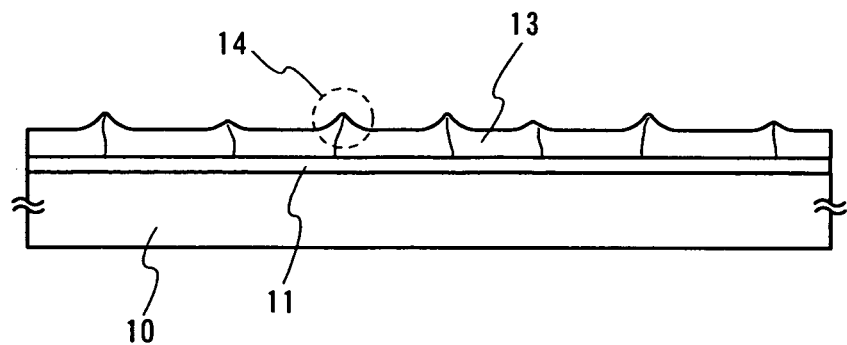
FIG. 5 is a diagram showing a polycrystalline semiconductor film formed by conventional laser annealing.

FIGS. 2A and 2B are diagrams showing the end portion of the stage 103 in detail. The substrate 114 over the stage 103 is floated by the substrate floating means 104 and is pinched by the chuck 107. The floating height of the substrate is adjusted by spouting and absorbing gas from opening pores provided for the stage 103 at the same time in the substrate floating means 104. Supersonic vibration is to be applied to the chuck 107 from the ultrasonic vibration 106.

As the substrate 114, for example, a commercially produced no-alkali glass substrate can be used. The thickness of the substrate is not limited, however, it is preferably to use a substrate having a thickness of approximately 0.2 to 2 mm. A base insulating film 115 formed of silicon nitride, silicon oxide, or the like is formed over the substrate 114, and a semiconductor film 116 with a thickness of 20 to 200 nm is formed thereon. The semiconductor film 116 may be an amorphous semiconductor film or a crystalline semiconductor film which is already crystallized by heat treatment or the like. Moreover, the structure shown in FIG. 2 is a structure in which the substrate 114 is pinched at two points using the chuck section 107, the present invention is not limited hereto, and a structure in which the substrate is pinched at plural points while being contacted with ultrasonic vibration source in plural points may be employed. Furthermore, the substrate can be fixed as an end side of the substrate are held down.

As shown in FIG. 2, the substrate is irradiated with a laser beam 117 overlapped each other as laser beams a to c by pulsed oscillation. Namely, the pulsed laser beams on the film are overlapped each other at 10 to 99 percent, preferably 80 to 98 percent.

As described in this embodiment, ultrasonic vibration can be applied with the substrate sufficiently by floating the substrate in space, and adding ultrasonic vibration from the end portion of the substrate. Consequently, the film can be crystallized without segregating impurities being mixed into a semiconductor film spontaneously to the specific region.

[Embodiment Mode 2]

Figure 6:
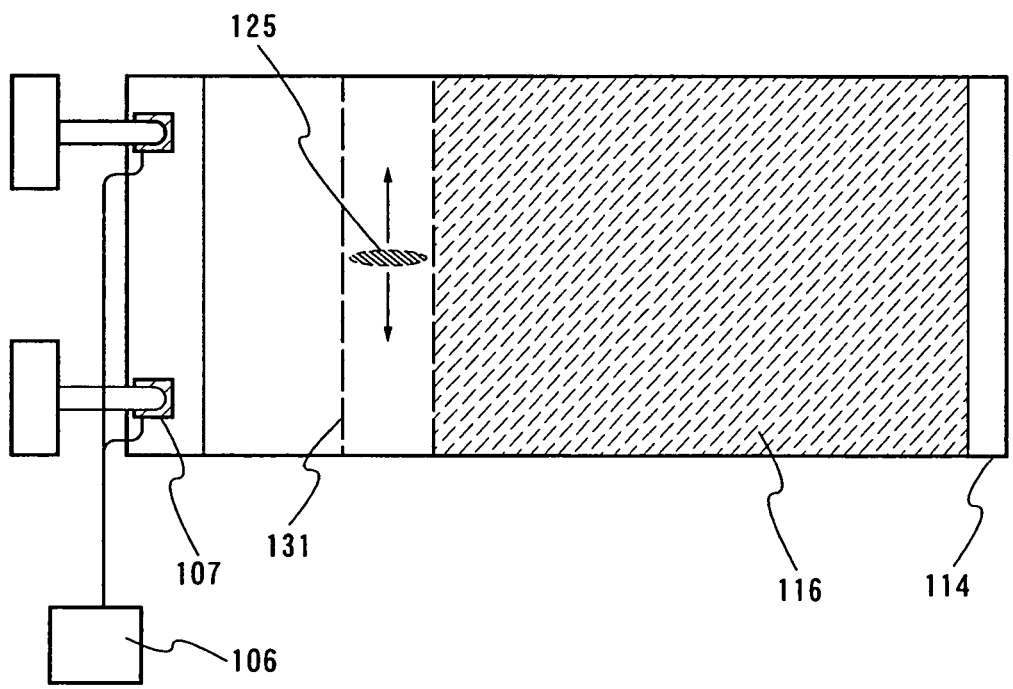
FIG. 6 is a diagram showing a mode of the laser processing apparatus according to the present invention.
Figure 7:
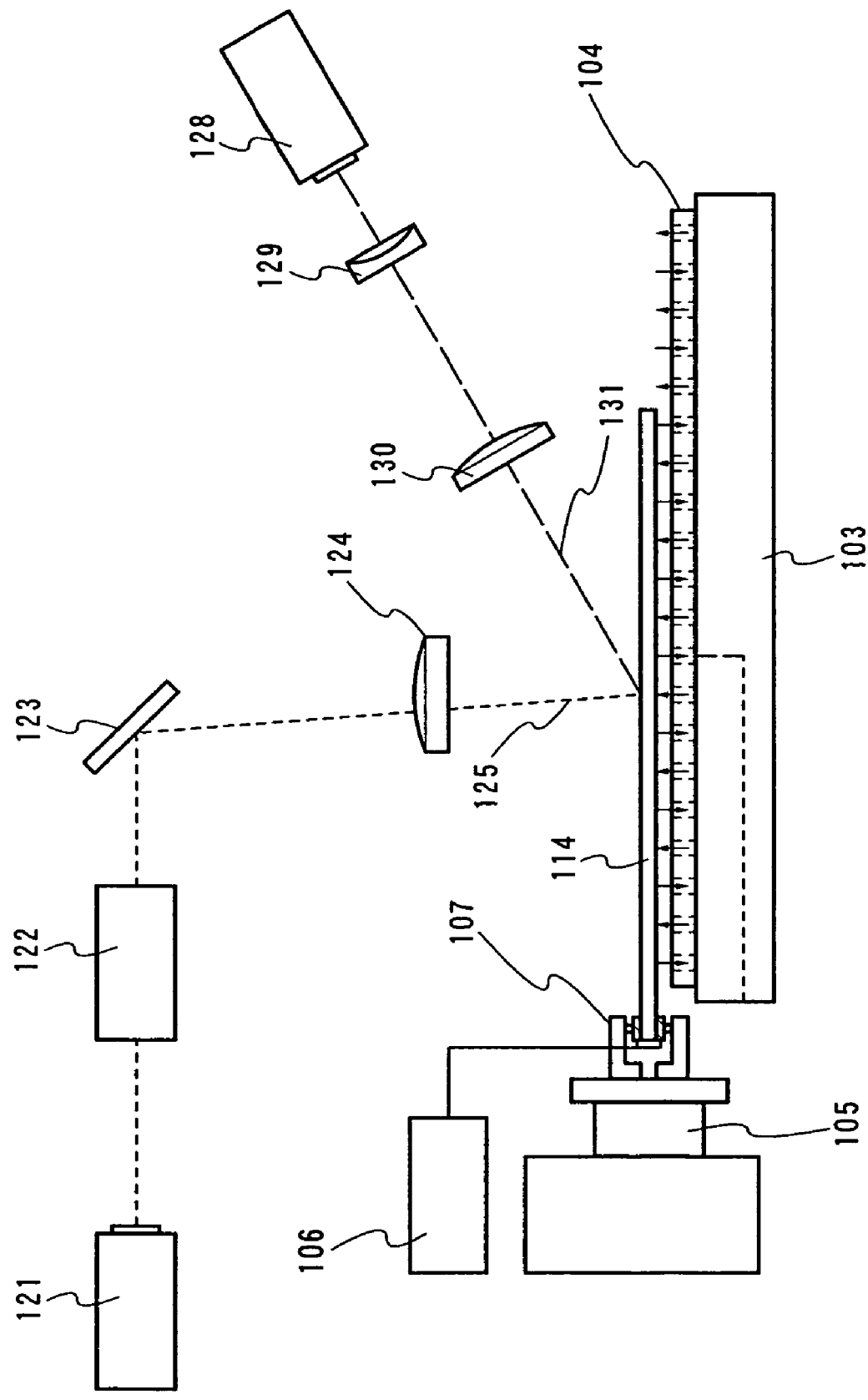
FIG. 7 is a diagram showing a stage section of the laser processing apparatus, and a conveyor means according to the present invention is detail.

In this embodiment mode, a mode of the laser processing apparatus in which the irradiated regions are overlapped with one another by using plural laser beams is explained using FIG. 6 and FIG. 7. In the laser processing apparatus of the present embodiment mode, the second harmonic of a solid-state laser is shaped and the laser beam in which shape of the laser spot is to be an oblong or a rectangle is scanned by using a polarization means of galvanometer mirror or the like, and the laser beam of fundamental wave is overlapped to the beam spot of second harmonic so as to provide more energy at the same time.

In FIG. 7, a solid-state laser oscillator for a laser diode type (LD) is preferably used as a first laser oscillator 121. For example, Nd:YVO$_4$ laser oscillator, continuous-wave laser (CW), or the second harmonic (532 nm) can be used. Preferably, the Nd: YVO$_4$ laser oscillator has an oscillation mode of TEM$_{00}$, LBO crystallization is incorporated in the resonator, and that of laser oscillator is changed to the second harmonic. The diameter of a beam is to be 2.25 mm, and the beam divergence is to be approximately 0.3 mrad.

An optical system 122 condenses laser beams in an oblong or a rectangle shape. For instance, since the beam spot of a laser beam which is outputted in an oscillation mode of TEM$_{00}$ have a cross section of a round shape, the optical system which transform the shapes described above into an oblong shape is to be a beam expander made of two pieces of cylindrical lens, in which the beam can be expanded only in one direction. In addition, the regular beam expander can be combined and used with the beam expander so that beam divergence may be controlled.

A laser beam which is transformed into an oblong shape is deflected by a deflection means 123. As the deflection means 123, a reflector such as a galvanometer mirror or a polygon mirror can be applied. The substrate 114 is irradiated with the deflected laser beam through a fθ lens 124. The first laser beam 125 transformed into an oblong shape is condensed onto the substrate 114 by the fθ lens 124, and thus, oblong beam, for example, having 20 um of minor axis and 400 um of major axis can be shaped.

The first laser beam 125 is scanned by changing the deflection angle of the deflection means 123. The change of a beam spot shape in the first laser beam 125 due to the angle of the deflection mean 123 can be controlled by the fθ lens 124. The incident angle of the first laser beam 125 against the main surface of the substrate 114 is set at 20 degrees. The occurrence of the interference with incident light from the first laser beam 125 and reflectance light from the backside of the substrate can be prevented. In the present embodiment mode, the deflection means 123 is scanned only in the uniaxial direction using a piece of galvanometer mirror. The substrate 114 is moved to the crossed direction toward uniaxial direction by a conveyor means for fully scanning the whole two-dimensional plane. The scanning speed of the first laser beam 125 is set to 100 to 2000 mm/s, preferably approximately, 500 mm/s.

A second laser oscillator 128 may be provided to irradiate the substrate 114 by the second laser beam 131 having fundamental wave (1064 nm) in accordance with the first laser beam 125 having the second harmonic (532 nm). As the second laser oscillator 128, a Nd:YAG laser oscillator of LD excitation is used. The second laser beam 131 is formed by, for example, enlarging the beam uniformly by a concave lens 129 and condensing the beam into one direction using a plane-convex cylindrical lens 130. Also, the similar beam can be formed by using an optical system having other structure. A homogenizer may be used in order to equalize the energy distribution of the second laser beam 131, then, the design of the homogenizer has to be performed in view of the interference of the laser beam. For example, a method of equalizing the energy distribution by dividing and combining laser beams is used in the homogenizer, in this case, a measure for making the optical path difference that is equal to or longer than the coherent length of the laser beam to each the divided laser beams is required to prevent the occurrence of interference.

A substrate floating means 104 is provided with a stage 103. The means 104, and a transporting means 105 for pinching the end of the substrate and moving the substrate unidirectionally or bidirectionally are combined. Thus, a conveyor means to conveyor the thin substrate can be formed while keeping the substrate in the space. The oscillation supplied from a ultrasonic vibration source 106 is provided with the chuck section 107 of the transporting means 105, and thus, the oscillation can be efficiently propagated through the substrate.

FIG. 6 is a diagram showing the end portion of the stage 103 in detail. It shows a mode of crystallizing an amorphous silicon film 116 formed onto the substrate 114. The substrate 114 is floated by the substrate floating means, and pinched by a chuck 107 of the transporting means 105. The chuck 107 is to be provided with ultrasonic vibration from the ultrasonic vibration source 106.

The second laser beam 131 is expanded to the scanning direction of the first laser beam 125 which is scanned by a deflection means. Preferable, the first laser beam 125 is to fully cover the region which is scanned in uniaxial direction and irradiated.

The fundamental wave of Nd:YAG laser with an oscillation wavelength of 1064 nm is small because the absorption coefficient of the silicon is not more than $10^4$/cm, however, the absorption coefficient of the fundamental wave is increased by irradiating the film by the second harmonic and the fundamental wave at the same time and dissolving the film thereof. Namely, crystallization is easily occurred using the fundamental wave by utilizing the rise of absorption coefficient in accordance with the liquefaction of the silicon. The effect thereof is that the sudden temperature change of the silicon film can be controlled and the energy of the second harmonic with small output can be assisted to make the crystallization easy. Unlike the higher harmonic, it is not necessary for the fundamental wave to use a nonlinear optical element for converting a wavelength, and it is possible to obtain a laser beam with a quite large output. For example, energy more than centuple of that of the higher harmonic can be obtained. Since the proof strength of the nonlinear optical element against the laser is quite weak, such energy difference is caused. In addition, the nonlinear optical element for generating the higher harmonic is likely to change in quality, and there are disadvantages in that a maintenance-free state that is an advantage of solid-state laser can not maintain for a long time, for instance.

According to the present embodiment mode, in the case where a melting zone is provided to a semiconductor film and the semiconductor film is scanned in succession for the crystallization, crystalizaiton without segregating impurities being mixed unintentionally into the specific regions is made possible and a crystalline semiconductor film without segregating impurities can be obtained, simultaneously.

[Embodiment Mode 3]

In this embodiment mode, a structure of a laser irradiation apparatus provided with a function which is to provide ultrasonic vibration to a substrate through solvent is explained with reference to FIG. 14.

Figure 14A:
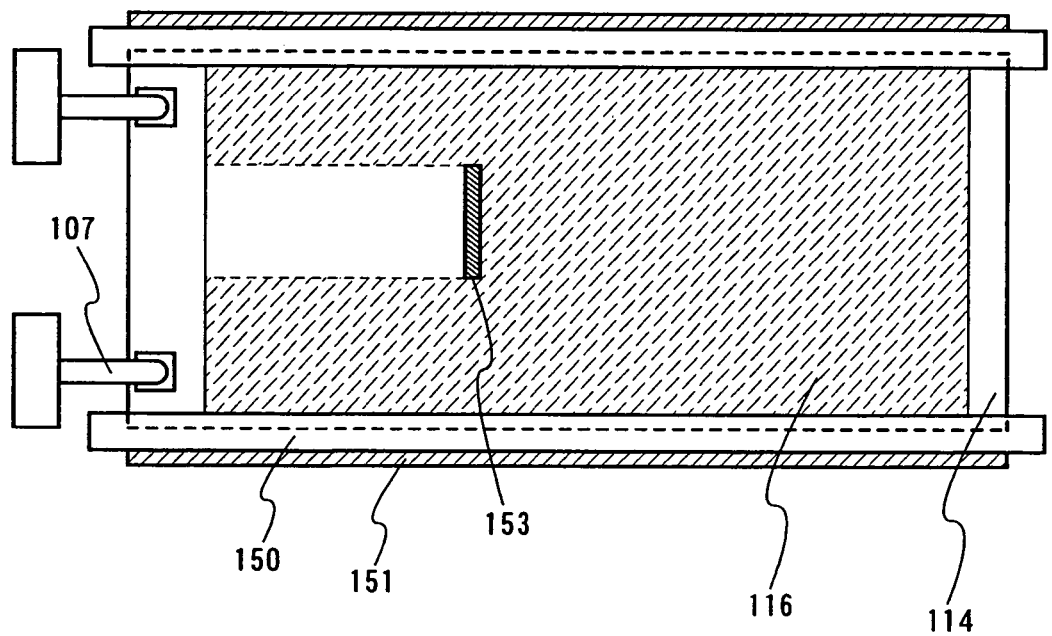
FIGS. 14A and 14B are diagrams showing a stage section of the laser processing apparatus, and a structure for applying ultrasonic vibration in detail.
Figure 14B:
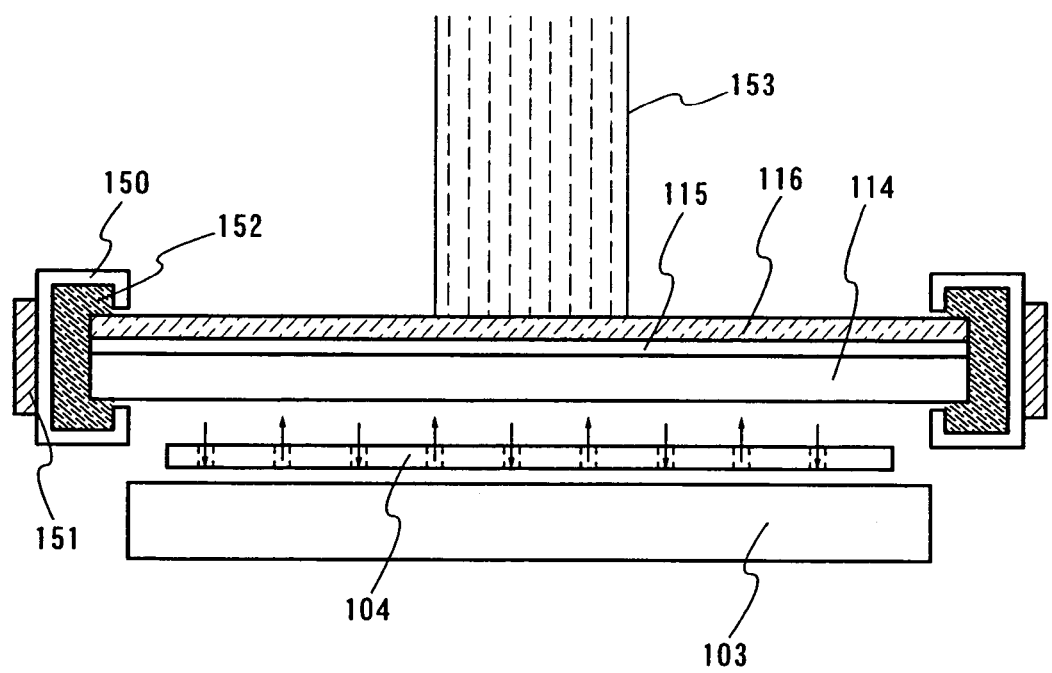

FIG. 14A is a diagram shown the top view of the substrate 114 that is irradiated by a laser beam 153, and guide rails 150 are provided with both ends of the substrate 114. Ultrasonic transducers 151 are provided with the guide rails 150, and thereby ultrasonic vibration is applied to the substrate 114. Namely, as shown in FIG. 14B, a solvent 152 is put in the guide rails 150, ultrasonic vibration is propagated to the substrate through the solvent 152. The solvent 152 may be a liquid solvent or jelled solvent, and impedance in the solvent is preferably close to that in the substrate, to be simplified, water can be used instead. As described above, ultrasonic vibration can be efficiently applied to the substrate 114 by contacting between ultrasonic transducer and liquid through a guide rail. In addition, the substrate 114 may be kept floated by the substrate floating means 104 provided to the stage 103.

As the substrate 114, for example, a commercially produced no-alkali glass substrate can be used, however, the film thickness is not limited, preferably, approximately, 0.2 to 2 mm. A base insulating film 115 is formed on the substrate 114, and a semiconductor film 116 with a thickness of 20 to 200 is formed thereon. The substrate 114 is held and fixed between the guide rails 150; a laser beam 153 may be moved over the substrate by a deflection means, or the substrate can be held by the chuck 107 and moved along the guide rails 150 while keeping the beam spot on the film of the laser beam 153 constant.

The laser beam 153 can be a pulsed laser beam, or a continuous-wave or continuous emission laser beam, and the types are not limited. Specifically, an optical system for laser irradiation in a laser processing apparatus of the present embodiment mode is not specifically limited, provided that the desired laser processing such as crystallization for the semiconductor film is possible. For example, the laser processing apparatus may include optical systems shown in Embodiment Mode 1 and/or Embodiment Mode 2 or the like.

According to the present embodiment mode, ultrasonic vibration can be easily applied to the direction parallel to the horizontal plane of the substrate 114. Thus, the film can be crystallized without segregating impurities being mixed unintentionally into a semiconductor film to the specific regions, and simultaneously, segregation of impurities and projections onto the surface of the semiconductor film due to the laser irradiation can be prevented from occurring.

[Embodiment Mode 4]

In the present invention, crystallization without segregating impurities is made possible by irradiating the substrate on which an amorphous semiconductor film is formed with a laser beam while ultrasonic vibration is applied. However, the invention is not limited hereto, and can be applied to the crystallization of the semiconductor film using a catalytic element.

Figure 8A:
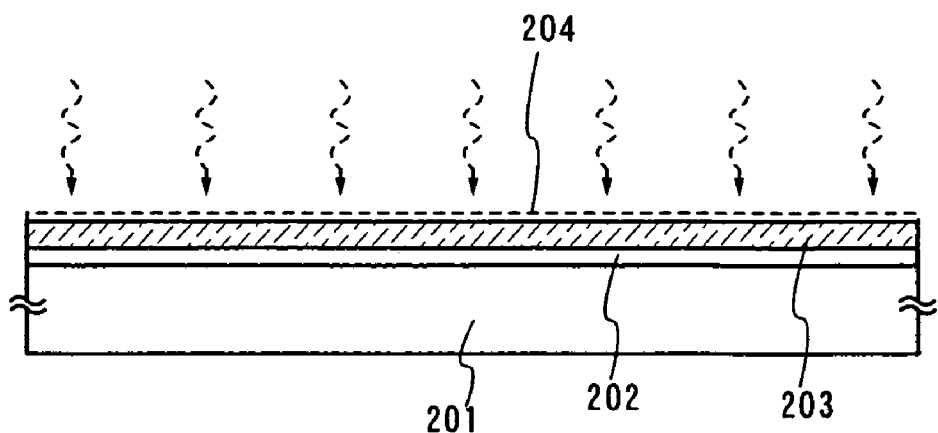
FIGS. 8A to 8C are diagrams showing a method for fabricating a semiconductor device according to the present invention.

First, as shown in FIG. 8A, a base insulating film 202 which is composed of an insulating film such as a silicon oxide film, a silicon nitride film, or a silicon oxynitride film, is formed on a substrate 201. Specifically, reactive gas of $SiH_4$, $NH_3$, and $N_2O$ is used to form a first silicon oxynitride film containing nitrogen more than or nearly equal to oxygen with plasma CVD at a substrate heating temperature of 400° C. and reactive gas of $SiH_4$ and $N_2O$ is used to form a second silicon oxynitride film containing oxygen more than nitrogen with plasma CVD at a substrate heating temperature of 400° C., to form the base insulating film 202 from the first and second silicon oxynitride films with a laminated structure.

In the laminated structure, the first oxynitride film may be substituted with a silicon nitride film formed with high-frequency sputtering. The silicon nitride film can prevent diffusion of a small amount of alkali metal such as sodium (Na) included in a glass substrate.

A semiconductor layer for forming channel, source, and drain portions of a TFT is obtained by crystallizing an amorphous silicon film 203 formed on the base insulating film 202. An amorphous silicon film formed with plasma CVD at a substrate heating temperature of 300° C. has a thickness from 20 to 60 nm. For the semiconductor layer, an amorphous silicon-germanium ($Si_{1-x}Ge_x$; x=0.001 to 0.05) film may be applied instead of the amorphous silicon film.

In order to perform crystallization, a metal element such as nickel (Ni), which has a catalytic action to crystallization of a semiconductor, is added. In FIG. 8A, heat treatment due to radiation heating or conduction heating is performed for crystallization after a platinum (Pt) containing layer 204 is kept on the amorphous silicon film 203. For example, RTA (Rapid Thermal Anneal) with radiation of a lamp as a heat source or RTA (gas RTA) with heated gas is performed at a heating temperature 740° C. for 180 seconds. The heating temperature is a temperature of a substrate measured with a pyrometer, and the temperature shall be a set temperature at heat treatment. Alternatively, heat treatment at 550° C. for 4 hours may be performed with an annealing furnace. The crystallizing temperature is lowered and time for crystallization is shortened due to the action of the metal element with the catalytic action.

Figure 8B:
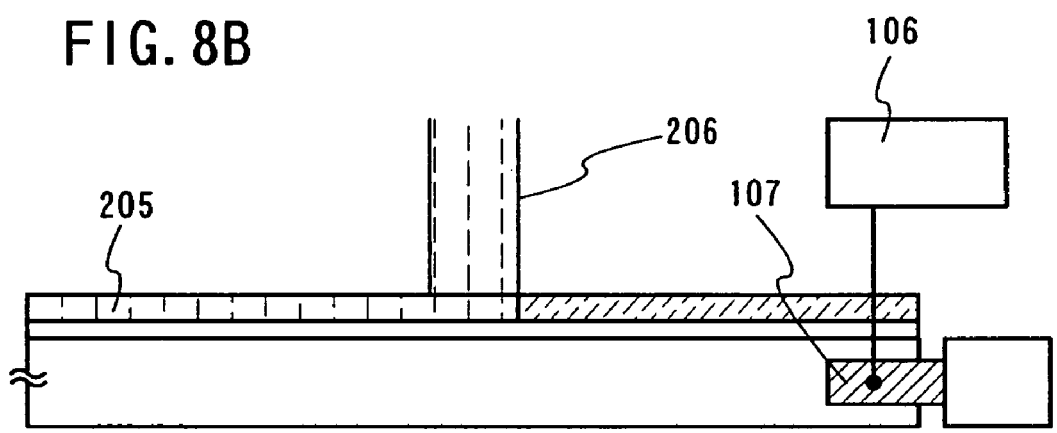

In order to further improve the crystallinity of thus formed crystalline silicon film 205, laser processing is performed (FIG. 8B). The laser processing can be performed by using the laser processing apparatus in the Embodiment Mode 1, Embodiment Mode 2, or Embodiment Mode 3. Namely, the substrate 201 is pinched in the chuck 107, provided with the ultrasonic vibration from ultrasonic vibration source 106, and irradiated with a laser beam 206 with pulsed oscillation or continuous oscillation. The laser beam 206 can be a pulsed excimer laser beam as shown in FIG. 1, a continuous-wave laser beam as shown in FIG. 7, or a continuous emission excimer laser beam.

Figure 8C:
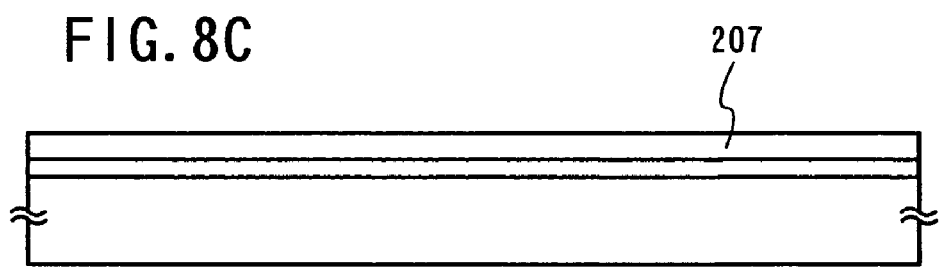

Owing to the irradiation of the laser beam 206, crystallinity can be improved; such as to increase the crystallization rate by eliminating an amorphous region. At the same time, a metal element which is left in a crystalline silicon film 205 can be dispersed. Thus, a crystalline silicon film 207 can be obtained. (FIG. 8C)

Figure 9:
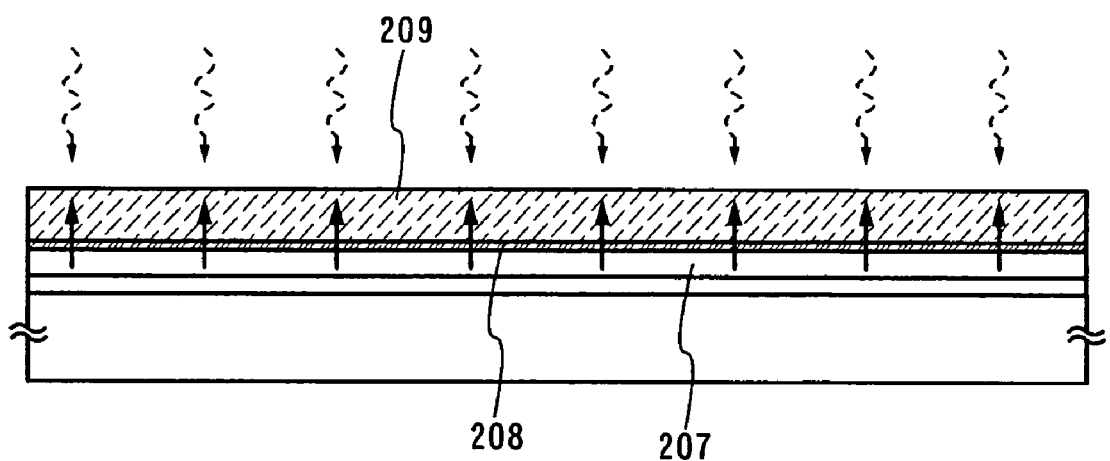
FIG. 9 is a diagram showing a method for fabricating a semiconductor device according to the present invention.

In order to remove impurities such as metal included in a crystalline silicon film, gettering shown in FIG. 9 is performed, which is especially effective for reducing platinum (Pt) to a concentration of $1 \times 10^{17}/cm^3$ or less. In FIG. 9, as a gettering site, an amorphous silicon film 209 is formed over the crystalline silicon film 207 with a barrier layer 208 therebetween. The amorphous silicon film 209 includes an impurity element such as phosphorous or boron, a rare gas element such as Ar, Kr, or Xe, or an element such as oxygen or nitrogen at $1 \times 10^{20}/cm^3$ or more to form a distortion. It is preferred that high-frequency sputtering is performed with Ar as sputtering gas to form the amorphous silicon film.

As heat treatment, RTA with a lamp as a heat source or RTA (gas RTA) with heated gas is performed at 750° C. for 180 seconds. Alternatively, heat treatment at 550° C. for 4 hours is performed with an annealing furnace. A metal element used for a catalyst is dispersed by a laser beam irradiation with added ultrasonic vibration, and thus, the metal element can be easily eliminated by the heat treatment. With the heat treatment, the metal element is segregated to the side of the amorphous silicon film 209, resulting in improving the purity of the semiconductor film 207. After the heat treatment, the amorphous silicon film 209 is removed with dry etching that uses $NF_3$ or $CF_4$, dry etching that does not use plasma of $ClF_3$, or wet etching using an alkali solution such as solution including hydrazine or tetra ethyl ammonium hydro oxide (($CH_3$)$_4$NOH). The barrier layer 208 is removed with hydrofluoric acid etching.

Thus, a crystalline semiconductor film can be obtained. However, the condition for crystallization and gettering which is described in FIGS. 8 and 9 is an example, the operator can properly decide the heat treatment temperature or the laser processing condition.

[Embodiment Mode 5]

In the present embodiment mode, fabricating processes of a semiconductor device will be described, which includes a processing stage to adding laser annealing to a portion with a laminate structure of a semiconductor film, a gate insulating film, and a conductive film.

Figure 10A:
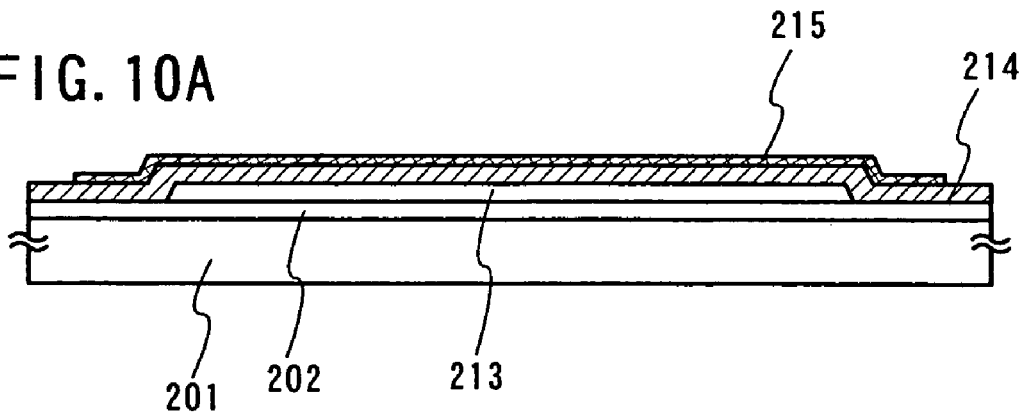
FIGS. 10A to 10C are diagrams showing a method for fabricating a semiconductor device according to the present invention.

First, etching a semiconductor film formed on a substrate into a desired shape in accordance with Embodiment Mode 4 for dividing the semiconductor film into an island-shape, thus, the semiconductor film 213 shown in FIG. 10A is obtained. In this way, a semiconductor film 213 is formed to be a main part of a TFT for a channel region and source and drain regions. As a substrate 201, a substrate such as a commercially produced no-alkali glass substrate can be used, and a base insulating film 202 including silicon nitride, silicon oxide, or silicon oxynitride is formed between the substrate and the semiconductor film with a thickness of 50 to 200 nm. Further, to the semiconductor film 213, doping of an impurity element for imparting a p-type is performed in order to shift threshold voltage to a plus side, or doping of an impurity element for imparting an n-type is performed in order to shift threshold voltage to a minus side.

Next, plural insulating films for the gate insulating film 214 are deposited on the semiconductor film 213 with a thickness of 10 to 120 nm. The gate insulating film 214 can be formed by a silicon oxide film, a silicon nitride film or a complex of those lamination films by using plasma CVD or high-frequency sputtering. When the gate insulating film is formed by sputtering, single crystal silicon is used for a target, and oxygen or nitrogen is used for sputtering gas. Sputtering is performed by inducing glow discharge through applying high frequency power of 1 to 120 MHz.

The gate insulating film 214 is to be laminated structure of, for example, silicon oxide film having 10 to 60 nm in thick and silicon nitride film having 10 to 30 nm in thick. Since, in the gate insulating film with the laminated structure, silicon nitride has a relative dielectric constant of about 7.5 with respect to a relative dielectric constant 3.8 of silicon oxide, it is possible to obtain an effect that is substantially equivalent to the case of obtaining a thinned insulating film.

With regard to the smoothness of the surface of the semiconductor film 213, a concave-convex shape can be a maximal value of 10 nm or less, preferably 5 nm or less by applying the ultrasonic vibration during the irradiation of a laser beam. Here, if the gate insulating film has a two-layer structure of the silicon oxide film and the silicon nitride film, it becomes possible to reduce gate leakage current and drive a TFT at 2.5 to 10 V, typically at 3.0 to 5.5 V, even if the gate insulating film has a total thickness from 30 to 80 nm.

After forming the gate insulating film 214, a first conductive film 215 is formed. A material of the first conductive film 215 is selected from high melting point metal such as molybdenum (Mo), tungsten (W), and titanium (Ti), metal nitride such as titanium nitride, tantalum nitride, and tungsten nitride, silicide such as tungsten silicide ($WSi_2$), molybdenum silicide ($MoSi_2$), titanium silicide ($TiSi_2$), tantalum silicide ($TaSi_2$), chromium silicide ($CrSi_2$), cobalt silicide ($CoSi_2$), and platinum silicide ($PtSi_2$), polysilicon to which phosphorous or boron is doped, and the like. The first conductive film 215 has a thickness from 10 to 100 nm, preferably from 20 to 50 nm.

Figure 10B:
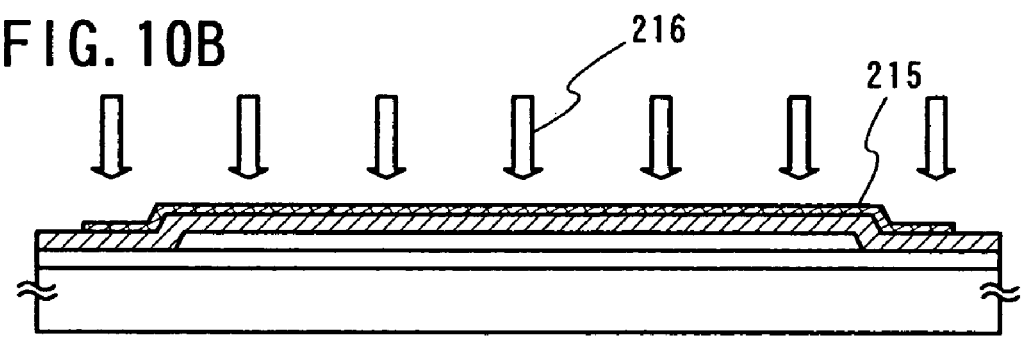

Then, as shown in FIG. 10B, irradiation of electromagnetic wave 216 from heat source is performed to the first conductive film 215 by RTA or flash lamp anneal in order to heat the conductive film. Temperature becomes high in the region in which the first conductive film 215 is formed, thus, local heat treatment becomes possible. With this local treatment, it is possible to oxidize or nitride a minute silicon cluster included in the film and to relax the inner distortion to reduce a defect density in the film and an interface defect state density.

Figure 10C:
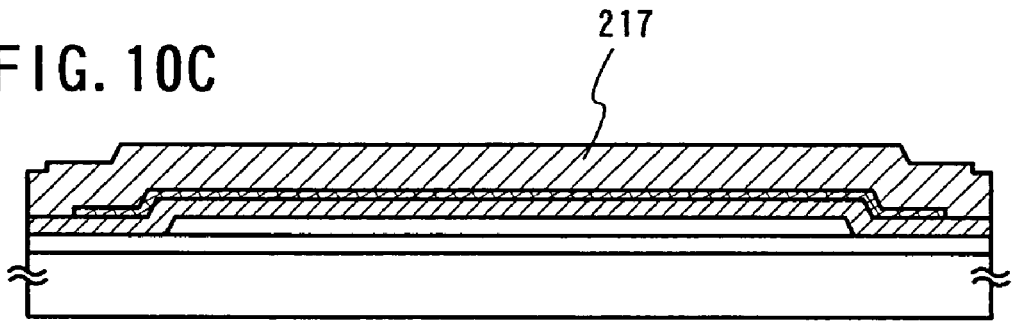

After that, as shown in FIG. 10C, an element selected form tantalum (Ta), tungsten (W), titanium (Ti), molybdenum (Mo), aluminum (Al), and copper (Cu), or an alloy or a compound containing the metal element above as its main component is deposited as a second conductive film 217. A gate electrode is formed by processing the first and second conductive films 215 and 217, and preferably, that the first conductive film 215 formed of a tantalum nitride (TaN) film is combined with the second conductive film 217 formed of a tungsten (W) film, or the first conductive film 215 formed of a tantalum nitride (TaN) film is combined with the second conductive film 217 formed of a titanium (Ti) film.

Figure 11A:
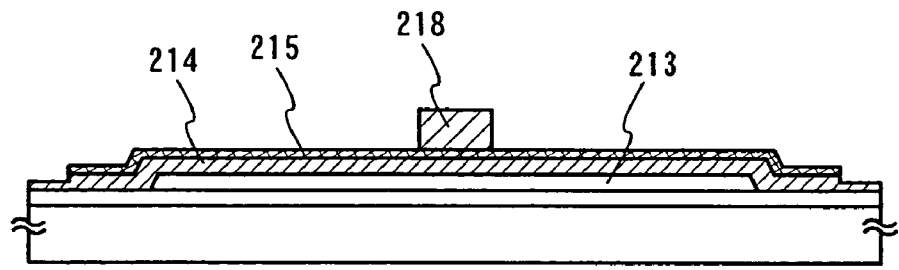
FIGS. 11A to 11E are diagrams showing a method for fabricating a semiconductor device according to the present invention.
Figure 11B:
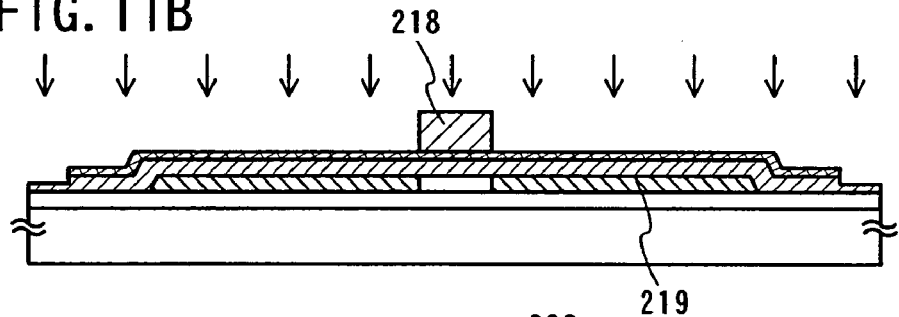

As shown in FIG. 11A, a second conductive layer 218 being etching processed by matching the pattern of the gate electrode is formed on the first conductive film 215. Then, impurities of one type of conductivity are doped into the semiconductor film using the second conductive layer 218 as a mask. The conductive type impurities are doped into the semiconductor film 213 through the first conductive film 215 and consequently, a first impurity region 219 is formed. (FIG. 11B)

Figure 11C:
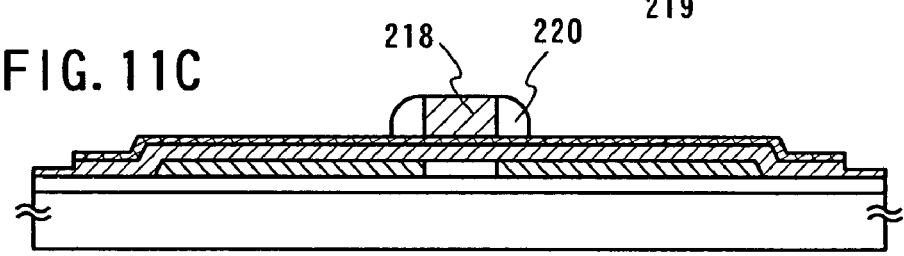
Figure 11D:
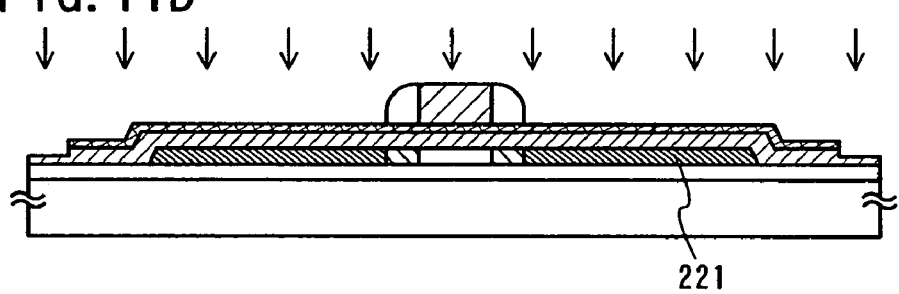
Figure 11E:
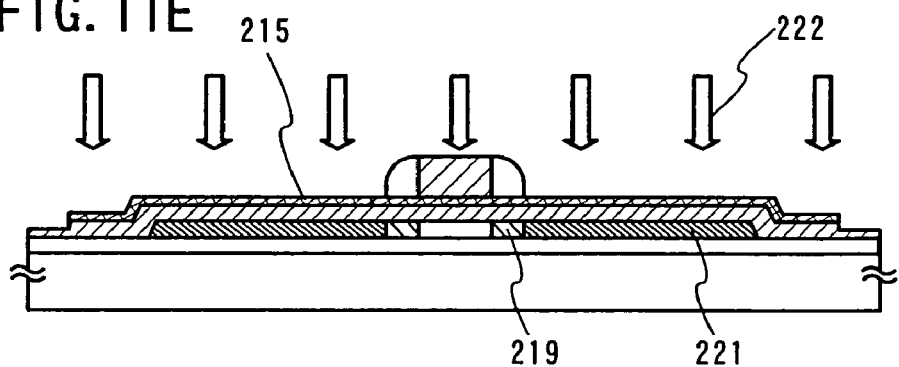

Then, an insulating film of such as silicon oxide film is formed onto the first conductive film 215 and the second conductive film 218, then, a side spacer 220 is formed by anisotropic etching. (FIG. 11C) A second impurity region 221 doped one type of conductivity impurities through the first conductive layer 215 is formed in self-aligning manner using the sides pacer 220 and the second conductive layer 218 as a mask during the doping process. (FIG. 11D)

As impurities of the one type of conductivity, an element such as phosphorous or arsenic, belonging to Group 15 in the periodic table, is used in the case of an n-type impurity (donor), and an element such as boron, belonging to Group 13 in the periodic table, is used in the case of a p-type impurity (acceptor). When the impurities are selected appropriately, it is possible to fabricate an n-channel TFT or a p-channel TFT. Further, it is possible to form an n-channel TFT and a p-channel TFT both on the same substrate only by adding a mask pattern for doping.

In order to activate the second impurity region 221 formed for a source and a drain and the first impurity region 219 formed for an LDD, irradiation of the laser beam 222 is performed to the semiconductor layer 213. Any one of laser processing apparatuses shown in the Embodiment Mode 1 to 3 can be used when irradiation of the laser beam 222 is performed.

Figure 12A:
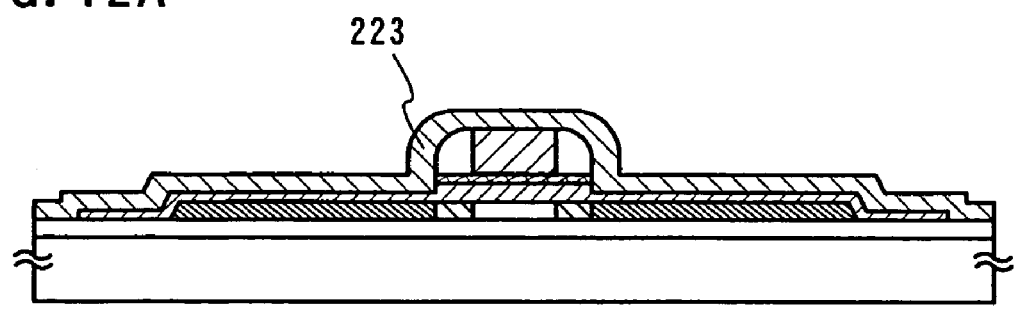
FIGS. 12A and 12B are diagrams showing a method for fabricating a semiconductor device according to the present invention.

Further, the first conductive layer 215 is etched using the second conductive layer 218 and the side spacer 220 as a mask. Then, mixed gas of $SiH_4$, $N_2O$, $NH_3$, and $H_2$ is used to form a silicon oxynitride film including hydrogen as a third insulating layer 223 with plasma CVD at a substrate heating temperature of 250 to 350° C., which has a film thickness from 50 to 200 nm. After that, heat treatment at 410° C. in a nitrogen atmosphere is performed for hydrogenation of the semiconductor layer. (FIG. 12A)

Figure 12B:
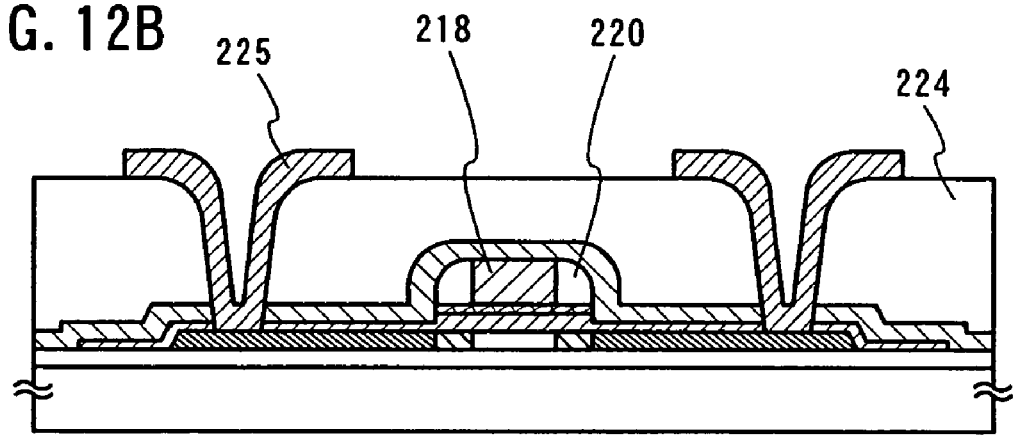

After that, a photosensitive or nonphotosensitive organic resin material containing a material such as acrylic or polyimide as its main component is used to form a fifth insulating layer 224. A wiring 225 formed of a conductive material such as Al, Ti, Mo or W is appropriately provided with the contact hole formed in the third to fifth insulating layers. When the organic resin material is used to form the fifth insulating film, capacitance between wirings is reduced and the surface has smoothness. Therefore, it is possible to realize providing wirings on the fifth insulating layer with high density. (FIG. 12B)

Thus, a TFT having a gate overlap LDD (Low concentration drain) structure can be completed. According to the present embodiment, a TFT in which influence of characteristic dispersion due to segregation of impurities is removed can be obtained.

[Embodiment Mode 6]

Figure 13:
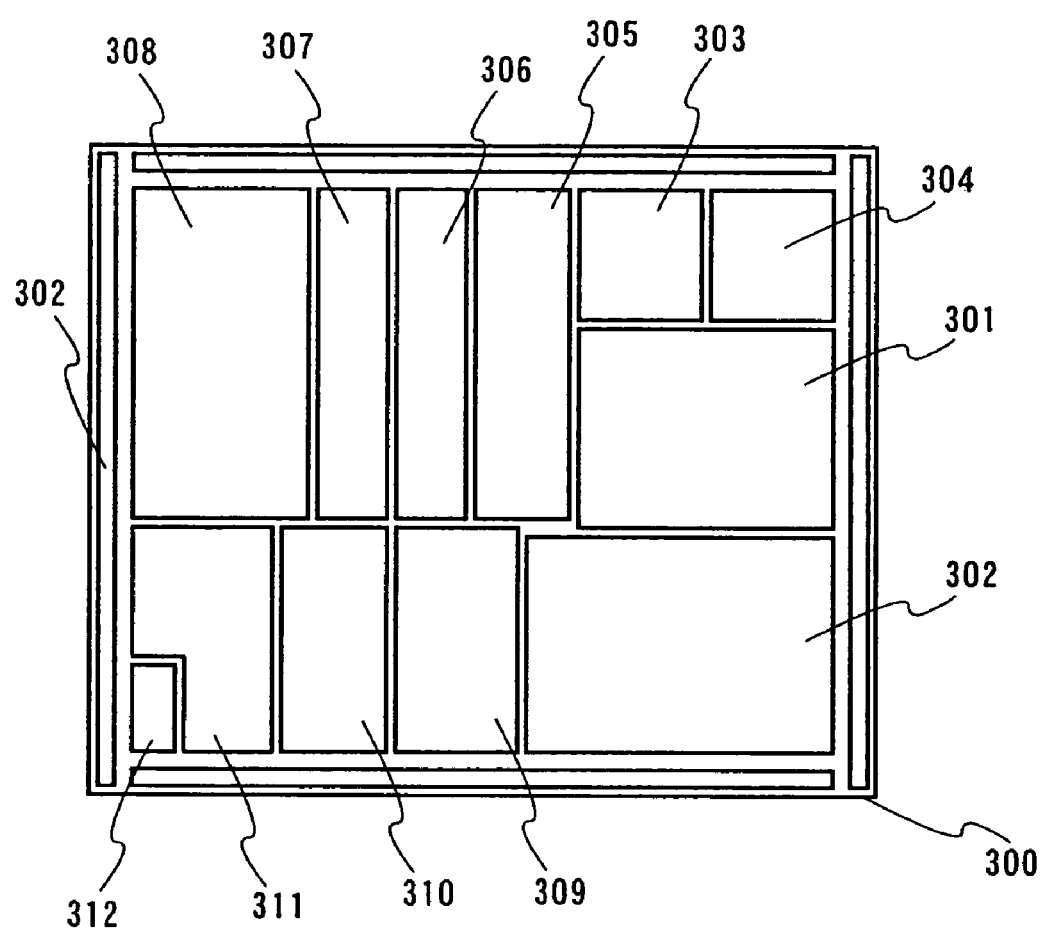
FIG. 13 is a diagram showing a structure of an integrated circuit according to the present invention.

An embodiment mode of a microcomputer will be described as a representative semiconductor device fabricated according to Embodiment Modes 5 with reference to FIG. 13. As shown in FIG. 13, a microcomputer integrataed various functional circuit sections on a glass substrate with a thickness of 0.3 to 1.1 mm can be realized. It is possible to form the various functional circuit sections with a integrated circuit fabricated in a TFT of the present Embodiment Mode 5.

Elements of a microcomputer 300 shown in FIG. 13 include a CPU 301, a ROM 302, an interrupt controller 303, a cache memory 304, a RAM 305, a DMAC 306, a clock generation circuit 307, a serial interface 308, a power supply generation circuit 309, an ADC/DAC 310, a timer counter 311, a WDT 312, an I/O port 302, and the like.

In this embodiment mode, a mode of a microcomputer is described as an example. However, semiconductor devices with various functions such as a media processor, a graphics LSI, an encryption LSI, a memory, and an LSI for cellular phones can be completed by changing structures and combinations of various functional circuits.

In addition, it is possible to fabricate a liquid crystal display device or an EL (electroluminescence) display device with using a TFT formed on a glass substrate. As electronic devices each using such display devices, a video camera, a digital camera, a goggles-type display (head mount display), a navigation system, a sound reproduction device (such as an in-car audio system and an audio set), a lap-top personal computer, a game machine, a portable information terminal (such as a mobile computer, a cellular phone, a portable game machine, and an electronic book), an image reproduction device including a recording medium (more specifically, an device which can reproduce a recording medium such as a digital versatile disc (DVD) and display the reproduced image), and the like can be given. Further, it is also possible to apply the liquid crystal display device or the EL display device as a display device incorporated in an electric home appliance such as a refrigerator, a washing machine, a microwave, a telephone, a facsimile, a vacuum sweeper, a thermos bottle, or rice cooker. As set forth above, the present invention can be applied quite widely to products in various fields.

According to the present invention, segregation of impurities can be prevented by applying ultrasonic vibration to the substrate with holding the end portion when reforming crystallinity and crystallization of a semiconductor device by using a laser beam irradiation. The energy of the ultrasonic vibration can be utilized to shatter and disperse the pieces of oxides and nitrides formed on the surface by a laser beam irradiation. Therefore, pieces of oxides can be prevented from concentrating in a grain boundary, and thus dispersion in electric resistance can be reduced.

In addition, a metal element left in the crystalline semiconductor film can be dispersed by applying the present invention to crystallize a semiconductor film using a catalytic element. Accordingly, thereafter, gettering can be easily performed.

What is claimed is:

1. A method for fabricating a semiconductor film comprising:

irradiating a semiconductor film formed over a substrate with a laser beam to crystallize the semiconductor film, wherein ultrasonic vibration is applied to the substrate through a chuck during irradiating the laser beam, and wherein the substrate is floated by the chuck holding an end portion of the substrate during irradiating the laser beam.

2. A method for fabricating a semiconductor film according to claim 1, wherein said laser beam is a $YVO_4$, a YAG, a YLF or an excimer laser.

3. A method for fabricating a semiconductor film comprising:

holding a substrate over a stage having pores wherein the substrate is provided with a semiconductor film; and spouting gases from the pores to the substrate; and irradiating the semiconductor film formed over the substrate with a laser beam, wherein during irradiating the laser beam, ultrasonic vibration is applied to the substrate through a chuck, and wherein during irradiating the laser beam, the substrate is floated by the chuck holding an end portion of the substrate and by spouting gases from the pores to the substrate.

4. A method for fabricating a semiconductor film according to claim 3, wherein said laser beam is a $YVO_4$, a YAG, a YLF or an excimer laser.

5. A method for fabricating a semiconductor device comprising:

forming a semiconductor film having an amorphous structure over a substrate; and irradiating the semiconductor film with a laser beam, wherein ultrasonic vibration is applied to the substrate through a chuck during irradiating the laser beam, and wherein the substrate is floated by the chuck holding an end portion of the substrate during irradiating the laser beam.

6. A method for fabricating a semiconductor device according to claim 5, wherein said laser beam is a $YVO_4$, a YAG, a YLF or an excimer laser.

7. A method for fabricating a semiconductor device according to claim 5, wherein said semiconductor device is used for a display device selected from the group consisting of a video camera, a digital camera, a goggle-type display, a navigation system, a sound reproduction device, a lap-top personal computer, a game machine, a portable information terminal, and an image reproduction device.

8. A method for fabricating a semiconductor device comprising:

forming a semiconductor film having an amorphous structure over a substrate; and irradiating the semiconductor film with a laser beam condensed into a linear shape in an oxygen atmosphere, and wherein ultrasonic vibration is applied to the substrate through a chuck during irradiating the laser beam, and wherein the substrate is floated by the chuck holding an end portion of the substrate during irradiating the laser beam.

9. A method for fabricating a semiconductor device according to claim 8, wherein said laser beam is a $YVO_4$, a YAG, a YLF or an excimer laser.

10. A method for fabricating a semiconductor device according to claim 8, wherein said semiconductor device is used for a display device selected from the group consisting of a video camera, a digital camera, a goggle-type display, a navigation system, a sound reproduction device, a lap-top personal computer, a game machine, a portable information terminal, and an image reproduction device.

11. A method for fabricating a semiconductor device comprising:

forming a semiconductor film having an amorphous structure over a substrate;

irradiating the semiconductor film with a laser beam condensed into a linear shape; and crystallizing a whole surface of the semiconductor film while overlapping a beam spot of the laser beam on the semiconductor film, wherein ultrasonic vibration is applied to the substrate through a chuck during irradiating the laser beam, and wherein the substrate is floated by the chuck holding an end portion of the substrate during irradiating the laser beam.

12. A method for fabricating a semiconductor device according to claim 11, wherein said laser beam is a $YVO_4$, a YAG, a YLF or an excimer laser.

13. A method for fabricating a semiconductor device according to claim 11, wherein said semiconductor device is used for a display device selected from the group consisting of a video camera, a digital camera, a goggle-type display, a navigation system, a sound reproduction device, a lap-top personal computer, a game machine, a portable information terminal, and an image reproduction device.

14. A method for fabricating a semiconductor device comprising:

forming a semiconductor film having an amorphous structure over a substrate;

crystallizing the semiconductor film having an amorphous structure by adding a metal element or a metal compound having catalytic action for enhancing a crystallization of the semiconductor film and by heat-treating; and irradiating the semiconductor film with a laser beam condensed into a linear shape, wherein ultrasonic vibration is applied to the substrate through a chuck during irradiating the laser beam, and wherein the substrate is floated by the chuck holding an end portion of the substrate during irradiating the laser beam.

15. A method for fabricating a semiconductor device according to claim 14, wherein said laser beam is a $YVO_4$, a YAG, a YLF or an excimer laser.

16. A method for fabricating a semiconductor device according to claim 14, wherein said semiconductor device is used for a display device selected from the group consisting of a video camera, a digital camera, a goggle-type display, a navigation system, a sound reproduction device, a lap-top personal computer, a game machine, a portable information terminal, and an image reproduction device.

17. A method for fabricating a semiconductor device according to claim 14, wherein said metal element is nickel or platinum.

18. A method for fabricating a semiconductor device comprising:
forming a semiconductor film having an amorphous structure over a substrate;
crystallizing the semiconductor film having the amorphous structure by adding a metal element or a metal compound having catalytic action for enhancing a crystallization of the semiconductor film and by heat-treating;
irradiating the semiconductor film with a laser beam condensed into a linear beam; and
improving a crystallinity of the semiconductor film while overlapping a beam spot of the laser beam on the semiconductor film,
wherein ultrasonic vibration is applied to the substrate through a chuck during irradiating the laser beam, and
wherein the substrate is floated by the chuck holding an end portion of the substrate during irradiating the laser beam.

19. A method for fabricating a semiconductor device according to claim 18,
wherein said laser beam is a YVO$_4$, a YAG, a YLF or an excimer laser.

20. A method for fabricating a semiconductor device according to claim 18,
wherein said semiconductor device is used for a display device selected from the group consisting of a video camera, a digital camera, a goggle-type display, a navigation system, a sound reproduction device, a lap-top personal computer, a game machine, a portable information terminal, and an image reproduction device.

21. A method for fabricating a semiconductor device according to claim 18,
wherein said metal element is nickel or platinum.

22. A method for fabricating a semiconductor device according to claim 1,
wherein a gas is supplied to a surface of the semiconductor film irradiated with the laser beam during irradiating the laser beam.

23. A method for fabricating a semiconductor device according to claim 3,
wherein a gas is supplied to a surface of the semiconductor film irradiated with the laser beam during irradiating the laser beam.

24. A method for fabricating a semiconductor device according to claim 5,
wherein a gas is supplied to a surface of the semiconductor film irradiated with the laser beam during irradiating the laser beam.

25. A method for fabricating a semiconductor device according to claim 8,
wherein a gas is supplied to a surface of the semiconductor film irradiated with the laser beam during irradiating the laser beam.

26. A method for fabricating a semiconductor device according to claim 11,
wherein a gas is supplied to a surface of the semiconductor film irradiated with the laser beam during irradiating the laser beam.

27. A method for fabricating a semiconductor device according to claim 14,
wherein a gas is supplied to a surface of the semiconductor film irradiated with the laser beam during irradiating the laser beam.

28. A method for fabricating a semiconductor device according to claim 18,
wherein a gas is supplied to a surface of the semiconductor film irradiated with the laser beam during irradiating the laser beam.

* * * * *